United States Patent

Desvignes

[15] 3,688,166

[45] Aug. 29, 1972

[54] SEMICONDUCTOR DEVICE FOR MODULATING ELECTROMAGNETIC RADIATION

[72] Inventor: Francois Desvignes, Bourg la Reine, France

[73] Assignee: U.S. Philips Corporation, New York, N.Y.

[22] Filed: Nov. 21, 1969

[21] Appl. No.: 878,744

[30] Foreign Application Priority Data

Nov. 27, 1968 France....................68,175529

[52] U.S. Cl. .........317/235 R, 317/235 N, 350/160 R

[51] Int. Cl. ............................................H01l 15/02

[58] Field of Search .317/235, 31; 250/203; 350/150, 350/160 R; 332/7.51

[56] References Cited

UNITED STATES PATENTS

| | | | |
|---|---|---|---|
| 3,295,911 | 1/1967 | Ashkin et al | 350/150 |
| 3,452,204 | 6/1969 | Love et al | 250/211 |
| 3,518,574 | 6/1970 | Rutz | 332/7.51 |
| 3,529,161 | 9/1970 | Oosthoek et al | 250/83.3 |
| 3,527,619 | 9/1970 | Miley | 136/89 |
| 3,463,925 | 8/1969 | Walker et al. | 250/203 |

*Primary Examiner*—John W. Huckert
*Assistant Examiner*—E. Wojciechowicz
*Attorney*—Frank R. Trifari

[57] ABSTRACT

A multiple semiconductor modulator for electromagnetic radiation, particularly suitable as an attitude sensor in artificial satellites consisting of a preferably circular semiconductor plate which is divided into sectors by contacts provided on oppositely located major surfaces of the plate. Each sector which is provided with an injecting contact on the one major surface and with a non-injecting contact on the opposite major surface forms an independent modulator.

15 Claims, 3 Drawing Figures

PATENTED AUG 29 1972 3,688,166
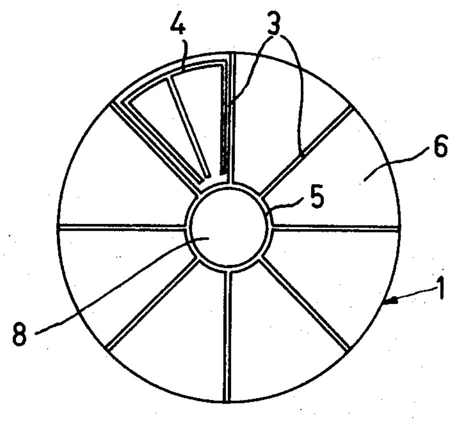
Fig.1
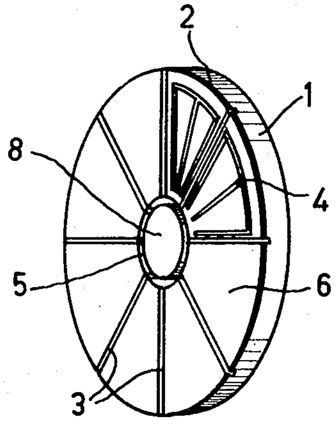
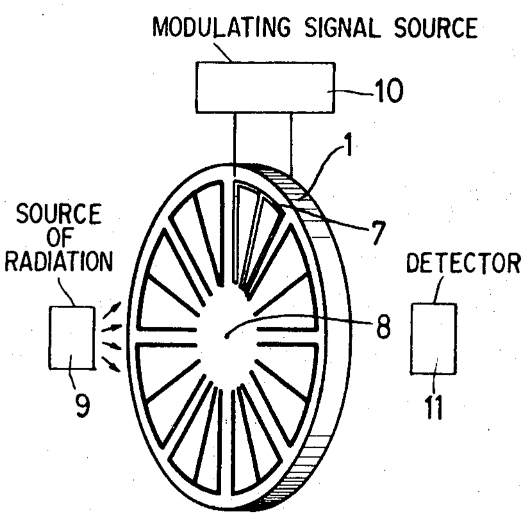
Fig.2 Fig.3
INVENTOR.
FRANCOIS DESVIGNES
BY
AGENT

SEMICONDUCTOR DEVICE FOR MODULATING ELECTROMAGNETIC RADIATION

The invention relates to a semiconductor device for modulating electromagnetic radiation comprising a semiconductor body having at least one injecting contact with which minority charge carriers can be injected into the body.

Modulators are widely used in all those cases in which an optic picture must be analyzed in its totality and in which an optical sensing system cannot be used. In that case the modulator supplies to the radiation detector a periodic radiation flux as a result of which inter alia deviations are avoided which are due to the heating of the detector.

When a modulator must be very reliable, for example, when used as an attitude sensor for artificial satellites, it is not desirable that moving components are present, Therefore, semiconductor modulators are preferably used.

The principle of such a semiconductor modulator is based on the variation of the absorption of the semiconductor plate in which the concentration of free charge carriers is varied by external influences.

Above the absorption threshold which corresponds to the charge carriers in the valence bond (for example, 1.8 to 2$\mu$ for germanium and 1.2$\mu$ for silicon) several absorption mechanisms are operative, in particular absorption by the atoms of the crystal lattice, by impurities, and by free charge carriers.

The capture cross-section $a_n$ of an electron and $a_p$ of a hole can be derived from measurements of the absorption coefficient caused by the presence of free charge carriers.

The absorption coefficient $\alpha$ caused by said charge carriers is related to their respective concentrations $n$ and $p$ according to the relationship $$\alpha = a_n n + a_p p.$$

In these circumstances, the variation $\delta T$ of the flux $T$ which is passed by a semiconductor plate in a certain direction over an elementary layer of thickness is given by the relationship:

$$\frac{d}{dx}\left(\frac{\delta T}{T}\right) = \delta\alpha$$

wherein $\delta\alpha$ is dependent upon the variation in the concentration of the free charge carriers in said elementary layer.

In order to vary the concentration of free charge carriers, the properties of biased p-n junction are used. This bias may be in the forward or in the reverse direction.

For theoretical reasons which will not be entered upon here, bias in the forward direction is used.

When the p-n junction is bias in the forward direction, the concentration of the charge carriers are varied. According to Shockley's theory these can be calculated as a function of the variation of the bias voltage.

A beam of, for instance infrared radiation which is incident on the semiconductor plate substantially perpendicular to the p-n junction, traverses regions with different concentrations of charge carriers. A part of the flux is absorbed and the variation of the transmission will be dependent upon the number of electrons and holes. Since in the range of from 8 to 30 microns the holes are much more strongly absorbing than the electrons, the modulation depth in said wavelength range can be kept substantially constant when the structure of the modulator is suitably chosen.

From French Pat. specification No. 1,089,676 a modulator is known in which a germanium crystal in the form of a parallelelepiped is used. In this case one of the longitudinal faces is provided with a single ohmic electrode while the oppositely Φ located face is provided with secondary electrodes which can inject minority charge carriers into the body. The radiation and the injected current can traverse the crystal in the same direction or according to mutually perpendicular directions. Such modulators have an entrance window of a small cross-section and are mainly used as frequency modulators.

In spite of the drawbacks which are due either to their small entrance window or to their dimensions, the use of such semiconductor modulators, notably in attitude sensors for artificial satellities, is of great importance. In determining the attitude of an artifical satellite relative to a reference triangle determined by astronomical beacons , optic systems are used which are oriented according to the axes of the reference triangle in which for an artificial satellite which is in orbit, for example, around the earth, the infrared radiation of the earth will be used to check two of the degrees of freedom of the artificial satellite, the third degree of freedom being checked by adjustment with respect to an astronomical beacon (sun or stars). Each of these three adjustments is surveyed by a separate optic system which forms a picture on a detector. In order to establish the direction of the optic beacon unambiguously, it is necessary to use a double radiation path.

The system of detector and associated electronic circuits can furthermore show errors as a result of the variation with time of various parameters. For correcting these errors a modulator is used. The latter moreover enables overheating of the radiation detector to be prevented and also the supply to a single detector of radiation which is applied along various paths. The radiation along each radiation path is modulated with a given frequency. A demodulator is used to separate the applied signals from one another.

Such a complicated system for determining the attitude of an artificial satellite, hence necessitates the use of the same number of modulators and radiation paths and, since for reasons of reliability all these devices are double, the place occupied by this whole system always is proportionally very large.

It is the object of the device according to the invention to remove or at least considerably reduce the above-mentioned drawbacks associated with known devices.

In connection herewith a device of the type mentioned in the preamble according to the invention is characterized in that the semiconductor body is in the form of a plate and is divided into at least two independent modulators in that the major surfaces of the plate-shaped body,are provided with at least two injecting contacts separated electrically from each other and at least one non-injecting contact, an injecting contact being each time situated opposite to a non-injecting contact which is situated on the other major surface.

All the injecting contacts are preferably situated on one major surface of the body, the non-injecting contacts being situated on the oppositely located major surface.

According to an important preferred embodiment, the plate-shaped semiconductor body consists of pairs of sectors situated diametrically opposite to each other, each sector comprising an injecting contact on one major surface and a non-injecting contact on the oppositely located major surface.

The semiconductor body is preferably constructed in the form of a circular plate.

Of particular advantage, especially when used as an attitude sensor, is an embodiment in which the body consists of 8 sectors situated diametrically opposite to each other and each constituting an independent radiation modulator. The plate-shaped body furthermore comprises advantageously a circular zone which is free from injecting contacts, the center of said zone coinciding substantially with the center of the semiconductor plate. When used as an attitude sensor, said neutral circular zone serves inter alia as a zero indicator. The injecting contacts can advantageously be formed by a diffused zone having a conductivity type opposite to that of the adjoining part of the body.

A preferred embodiment which can be manufactured in a particularly simple manner is characterized in that a major surface of the body comprises a diffused layer having a conductivity type opposite to that of the adjoining part of the body, said layer being divided in at least two parts by at least one electrically insulating zone, said parts forming individual injecting contacts. These electrically insulating zones can be formed, for example, by grooves provided in the said major surface and having a depth exceeding the thickness of the diffused layer.

According to another preferred embodiment at least one injecting contact is formed by an alloy contact.

The said diffused zones are advantageously provided with comb-shaped non-rectifying connection contact. The non-injecting contacts are preferably also constructed as comb-shaped as well as the said alloy contacts. In all these cases contact geometries are preferably used, in which the teeth of the comb-shaped contacts extend in radial directions.

In order that the invention may be readily carried into effect, a few examples thereof will now be described in greater detail, by way of example, with reference to the accompanying drawings, in which FIG. 1 is a diagrammatic plan view of a device according to the invention.

FIG. 2 is a diagrammatic perspective view of the device shown in FIG. 1, and

FIG. 3 is a diagrammatic perspective view of another device according to the invention.

According to a first embodiment as shown in FIG. 1 and 2, a circular plate (1) of p-type germanium, diameter 30 mm, is used as the starting material. After polishing and chemically etching, a diffused n-type layer (2) is provided in one major surface of said plate (see FIG. 2) by diffusion of antimony. This diffused layer is approximately 10 microns thick. The value of said thickness is determined in practice by the desired value of the series resistance of the modulator.

By vapor deposition or any other conventional method, comb-shaped ohmic contacts 4 are provided on the front and rear surfaces of the semiconductor plate. These interdigital contacts each have three teeth which extend in radial direction and have a width of approximately 0.2 mm. The comb-shaped contacts are situated opposite to each other on oppositely located major surfaces of the plates.

The sectors determined by said comb-shaped contacts are separated from each other by grooves 3 extending in radial directions and grooves 5 extending concentrically with the circular plate circumference. These grooves can be obtained, for example, by means of photolithographic etching methods conventionally used in semiconductor technology. The grooves divide the diffused layer 2 into eight sectors 6 situated diametrically opposite to each other and forming the injecting contacts of the modulator.

Connection conductors are then soldered on each sector.

According to another embodiment, the starting material is a plate of n-type germanium and the injecting p-n junction is obtained by diffusion of aluminum.

Instead of diffused injecting contacts, alloy contacts may alternatively be used. FIG. 3 shows an embodiment in which indium is provided on one of the major surface of an n-type germanium plate via efficaciously provided masks, after which the indium is alloyed. In this case injecting contacts 7 are formed. On the other major surface ohmic contacts are then provided, according to conventional methods, opposite to the said injecting alloy contacts. As in the preceding example, all these contact are comb-shaped.

In all these cases a circular zone 8 is exposed in the center of the semiconductor plate. This zone 8 has a dual purpose: first, the distance between the teeth of the comb-shaped contact on one and the same sector is kept sufficiently large so as to avoid undesirable surface currents, and, secondly, in the case of the use of such a modulator as an attitude sensor in an artificial satellite, said neutral zone may be used as a zero indicator in which said zone will preferably have the same diameter as the picture of the relative celestial body at the area of the semiconductor plate.

If desired, said neutral zone may be removed entirely or be replaced by a screen which is soldered to the surface of the modulator or held in place in a different manner.

During operation of the devices described, radiation is incident on one of the major surfaces from a source of radiation. The radiation emerging on the other major surface of the semiconductor plate is modulated by applying a variable voltage from modulating signal source 10 between an injecting contact and the non-injecting contact corresponding thereto on the oppositely located major surface.

Since the modulator can be used in combination with one single bolometer in detector 11, the latter may serve for detecting the radiation originating from all the pairs of the radiation paths which correspond to the pairs of sectors situated diametrically opposite to each other. In order to be able to separate from each other the signals originating from said pairs of sectors, either the p-p junction for two different pairs can be bias alternatively or both pairs can be bias simultaneously but by means of voltage pulses of different frequencies, after which the signals are separated by demodulation by means of an electronic circuit.

It will be obvious that the invention is not restricted to the examples described, but that many variations are possible to those skilled in the art without departing from the scope of this invention. For example, materials other than germanium may also be used, for example, silicon or III–V compounds. Instead of comb-shaped contacts, contacts may be used in the form of electrode layers which are permeable to the radiation used. The individual modulators of the semiconductor plate may in circumstances also advantageously have a common non-injecting contact. The device according to the invention may furthermore have a non-circular geometry and may also be used for purposes other than attitude sensors.

What is claimed is:

1. A semiconductor device for modulating incident electromagnetic radiation, comprising a plate-shaped semiconductor body having opposed major surfaces and being divided into at least one pair of sectors situated opposite to each other, an injecting contact on one surface of each of the sectors, and a non-injecting contact on the other surface of each of the sectors, each sector together with the associated contacts forming an independent modulator transmissive to incident on a major surface of the body radiation, in combination with means to impinge the incident radiation on one major surface of the body and means to utilize the modulated radiation emanating from the other major surface of the body.

2. A semiconductor device as claimed in claim 1, wherein all of the injecting contacts are situated on the same major surface of the body.

3. A semiconductor device as claimed in claim 1 wherein the body is of circular shape.

4. A semiconductor device as claimed in claim 1 wherein the body comprises of eight sectors situated diametrically opposite to each other.

5. A semiconductor device as claimed in claim 1, wherein the plate-shaped semiconductor body comprises a circular zone which is free from injecting contacts, the center of said zone coinciding substantially with the center of the semiconductor plate.

6. A semiconductor device as claimed in claim 1 wherein at least one injecting contact is formed by a diffused zone having an conductive type opposite to that of the adjoining part of the body.

7. A semiconductor device as claimed in claim 5, wherein a major surface of the body comprises a diffused layer having a conductivity type opposite to that of the adjoining part of the body, said layer being divided into at least two parts by at least one electrically insulating zone, said parts forming individual injecting contacts.

8. A semiconductor device as claimed in claim 6, wherein the electrically insulating zones are formed by grooves provided in the said major surface and having a depth exceeding the thickness of the diffused layer.

9. In a semiconductor device as claimed in claim 1, wherein at least one injecting contact is an alloy contact.

10. A semiconductor device as claimed in claim 6, wherein each diffused zone is provided with a comb-shaped non-rectifying connection contact.

11. A semiconductor device as claimed in claim 1, wherein the non-injecting contacts are comb-shaped.

12. A semiconductor device as claimed in claim 7, wherein the alloy contacts are comb-shaped.

13. A semiconductor device as claimed in claim 11, wherein said body is a circular shaped and the digits of the comb-shaped contacts extend in radial directions.

14. A semiconductor device as claimed in claim 1, wherein the utilizing means converts the emanating radiation into an electric signal and means are present for applying an electric voltage between the injecting contact and the non-injecting contact of one of said modulators, as a result of which minority charge carriers are injected into the body.

15. A semiconductor device in combination as claimed in claim 1 further comprising means to apply a modulation signal to said contacts whereby said incident radiation is modulated.

* * * * *

PO-1050
(5/69)

UNITED STATES PATENT OFFICE
CERTIFICATE OF CORRECTION

Patent No. 3,688,166 Dated August 29, 1972

Inventor(s) FRANCOIS DESVIGNES

It is certified that error appears in the above-identified patent and that said Letters Patent are hereby corrected as shown below:

Section [30] change "68,175529" to --175529--.

Signed and sealed this 30th day of January 1973.

(SEAL)
Attest:

EDWARD M.FLETCHER,JR.
Attesting Officer

ROBERT GOTTSCHALK
Commissioner of Patents